United States Patent
Liu et al.

(10) Patent No.: US 9,426,889 B2
(45) Date of Patent: Aug. 23, 2016

(54) ASSEMBLY OF A CIRCUIT BOARD AND A FLEXIBLE FLAT CABLE, CIRCUIT BOARD, AND ASSEMBLING METHOD FOR A FLEXIBLE FLAT CABLE

(71) Applicant: Wistron Corporation, New Taipei (TW)

(72) Inventors: Yu-Ju Liu, New Taipei (TW); Che-Wen Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 64 days.

(21) Appl. No.: 14/231,411

(22) Filed: Mar. 31, 2014

(65) Prior Publication Data
US 2015/0114694 A1  Apr. 30, 2015

(30) Foreign Application Priority Data
Oct. 25, 2013  (TW) .............................. 102219916 U

(51) Int. Cl.
*H05K 1/14* (2006.01)
*H05K 1/11* (2006.01)
*H05K 3/34* (2006.01)

(52) U.S. Cl.
CPC ............... *H05K 1/147* (2013.01); *H05K 1/117* (2013.01); *H05K 3/3405* (2013.01); *H05K 2201/09063* (2013.01); *H05K 2201/09154* (2013.01); *H05K 2201/09163* (2013.01); *H05K 2201/10356* (2013.01); *H05K 2201/2027* (2013.01); *Y10T 29/49181* (2015.01)

(58) Field of Classification Search
CPC ..... H05K 1/0281; H05K 3/361; H05K 1/142; H05K 1/147

USPC .................................. 174/254, 268; 361/789
See application file for complete search history.

(56) References Cited

U.S. PATENT DOCUMENTS

| | | | | |
|---|---|---|---|---|
| 4,054,348 A * | 10/1977 | Stroupe | .................. | H05K 3/365 439/329 |
| 5,777,855 A * | 7/1998 | Yokajty | .................. | H01R 12/62 361/749 |
| 6,595,796 B1 * | 7/2003 | Koegel | ................. | H01R 12/777 439/495 |
| 7,710,740 B2 * | 5/2010 | Liu | ........................ | H05K 1/147 361/748 |
| 2007/0232127 A1 * | 10/2007 | Lin | ........................ | H01R 12/62 439/492 |
| 2009/0142955 A1 * | 6/2009 | Fujikawa | ............... | H05K 1/147 439/449 |

* cited by examiner

*Primary Examiner* — Michael F McAllister
(74) *Attorney, Agent, or Firm* — Jianq Chyun IP Office

(57) ABSTRACT

An assembly includes a circuit board and a flexible flat cable. The circuit board includes a board body having top, bottom and side faces, and a connection module. The board body is formed with a positioning slot that is formed through the top and bottom faces and that has a first length, and an opening that extends from the side face and that is in spatial communication with the positioning slot. The opening is formed through the top and bottom faces and has a second length shorter than the first length. The flexible flat cable includes a connection unit and a cable main body that has a width greater than the second length. The cable main body is able to pass through the opening, and extends through and is positioned in the positioning slot.

12 Claims, 11 Drawing Sheets

ASSEMBLY OF A CIRCUIT BOARD AND A FLEXIBLE FLAT CABLE, CIRCUIT BOARD, AND ASSEMBLING METHOD FOR A FLEXIBLE FLAT CABLE

CROSS-REFERENCE TO RELATED APPLICATION

This application claims priority of Taiwanese Application No. 102219916, filed on Oct. 25, 2013, the entire disclosure of which is incorporated herein by reference.

BACKGROUND OF THE DISCLOSURE

1. Field of the Disclosure

The present disclosure relates to an assembly of a flexible flat cable and a circuit board, more particularly to: an assembly of a flexible flat cable and a circuit board in which the flexible flat cable is positioned by a positioning mechanism of a circuit board; the circuit board; and an assembling method for the flexible flat cable.

2. Description of the Related Art

A conventional flexible flat cable (FFC) includes a plurality of core wires. A circuit board includes a plurality of conductive contacts equal in number to the aforesaid core wires. The core wires are respectively fixed by a welding manner to the conductive contacts such that each of the core wires of the flexible flat cable is connected electrically to respective one of the conductive contacts, thereby enabling transmission of electrical signals.

Since the flexible flat cable is fixed to the circuit board merely by welding the core wires of the flexible flat cable on the conductive contacts of the circuit board, a connection strength between the flexible flat cable and the circuit board is weak. As a result, when being pulled by an external force, the flexible flat cable is vulnerable to fracturing of the core wires, resulting in separation of the flexible flat cable from the circuit board.

SUMMARY OF THE DISCLOSURE

Therefore, an object of the present disclosure is to provide an assembly of a flexible flat cable and a circuit board that may enhance a connection strength between the flexible flat cable and the circuit board to prevent separation of the flexible flat cable from the circuit board when the flexible flat cable is pulled by an external force.

Accordingly, an assembly of a circuit board and a flexible flat cable of the present disclosure includes a circuit board and a flexible flat cable.

The circuit board includes a board body and a connection module disposed on the board body. The board body includes a top face, a bottom face, and a side face connected between the top face and the bottom face. The connection module is disposed on the top face. The board body is formed with a positioning slot that is formed through the top face and the bottom face and that is spaced apart from and disposed between the connection module and the side face, and an opening that extends from the side face to the positioning slot and that is in spatial communication with the positioning slot. The positioning slot is elongated and has a first length. The opening is formed through the top face and the bottom face and has a second length shorter than the first length. The board body further includes a long side that defines one side of the positioning slot adjacent to the connection module. The long side faces toward the opening.

The flexible flat cable includes a cable main body and a connection unit extending from one end of the cable main body. The connection unit is fixed to the connection module and is connected electrically to the connection module. The cable main body has a width greater than the second length. The cable main body is able to pass through the opening, and extends through and is positioned in the positioning slot.

Another object of the present disclosure is to provide a circuit board that may enhance a connection strength between a flexible flat cable and the circuit board to prevent separation of the flexible flat cable from the circuit board when the flexible flat cable is pulled by an external force.

According to another aspect, a circuit board of the present disclosure is suitable for assembling with a flexible flat cable. The flexible flat cable includes a cable main body and a connection unit extending from one end of the cable main body. The cable main body has a width. The circuit board includes a board body and a connection module.

The board body includes a top face, a bottom face, and a side face connected between the top face and the bottom face. The board body is formed with a positioning slot that is formed through the top face and the bottom face and that is spaced apart from the side face, and an opening that extends from the side face to the positioning slot and that is in spatial communication with the positioning slot. The positioning slot is elongated and has a first length. The opening is formed through the top face and the bottom face and has a second length shorter than the first length. The width of the cable main body is greater than the second length. The cable main body is able to pass through the opening to extend through and be positioned in the positioning slot. The connection module is disposed on the top face of the board body and is configured to fix the connection unit and to connect electrically to the connection unit. The positioning slot of the board body is disposed between the connection module and the side face. The board body further includes a long side that defines one side of the positioning slot adjacent to the connection module. The long side faces toward the opening.

Yet another object of the present disclosure is to provide an assembling method for a flexible flat cable that may enhance convenience of assembling the flexible flat cable with a circuit board such that the flexible flat cable may be assembled with and fixed on the circuit board quickly and conveniently.

According to yet another aspect, an assembling method for a flexible flat cable of the present disclosure is suitable for assembling the flexible flat cable with a circuit board. The circuit board includes a board body and a connection module. The board body includes a top face, a bottom face, and a side face connected between the top face and the bottom face. The connection module is disposed on the top face. The board body is formed with a positioning slot that is formed through the top face and the bottom face and that is spaced apart from and disposed between the connection module and the side face, and an opening that extends from the side face to the positioning slot and that is in spatial communication with the positioning slot. The positioning slot is elongated and has a first length. The opening is formed through the top face and the bottom face and has a second length shorter than the first length. The flexible flat cable includes a cable main body and a connection unit extending from one end of the cable main body. The cable main body has a width greater than the second length.

The assembling method including the steps of:

(A) fixing the connection unit of the flexible flat cable to the connection module of the circuit board such that the connection unit and the connection module are connected electrically;

(B) bending the cable main body toward the side face of the circuit board such that the cable main body is formed with a bend portion corresponding to the opening; and (C) forcing the bend portion of the cable main body toward a direction of the opening such that the bend portion passes through the opening and extends through and is positioned in the positioning slot.

BRIEF DESCRIPTION OF THE DRAWINGS

Other features and advantages of the present disclosure will become apparent in the following detailed description of the embodiments with reference to the accompanying drawings, of which.

DETAILED DESCRIPTION OF THE EMBODIMENTS

Figure 1:
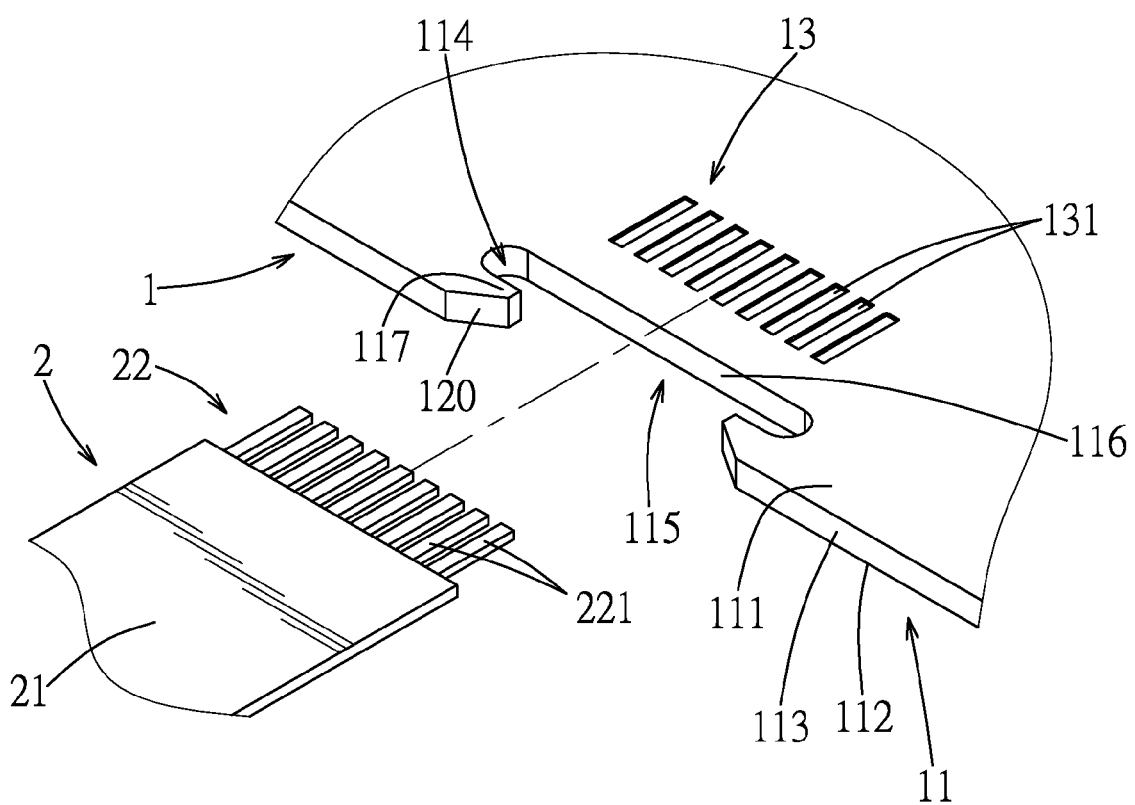
FIG. 1 is a schematic fragmentary exploded perspective view of a first embodiment of an assembly of a flexible flat cable and a circuit board according to the present disclosure, illustrating an assembling relationship between the flexible flat cable and the circuit board.

Before the present disclosure is described in greater detail, it should be noted that like elements are denoted by the same reference numerals throughout the disclosure.

Figure 2:
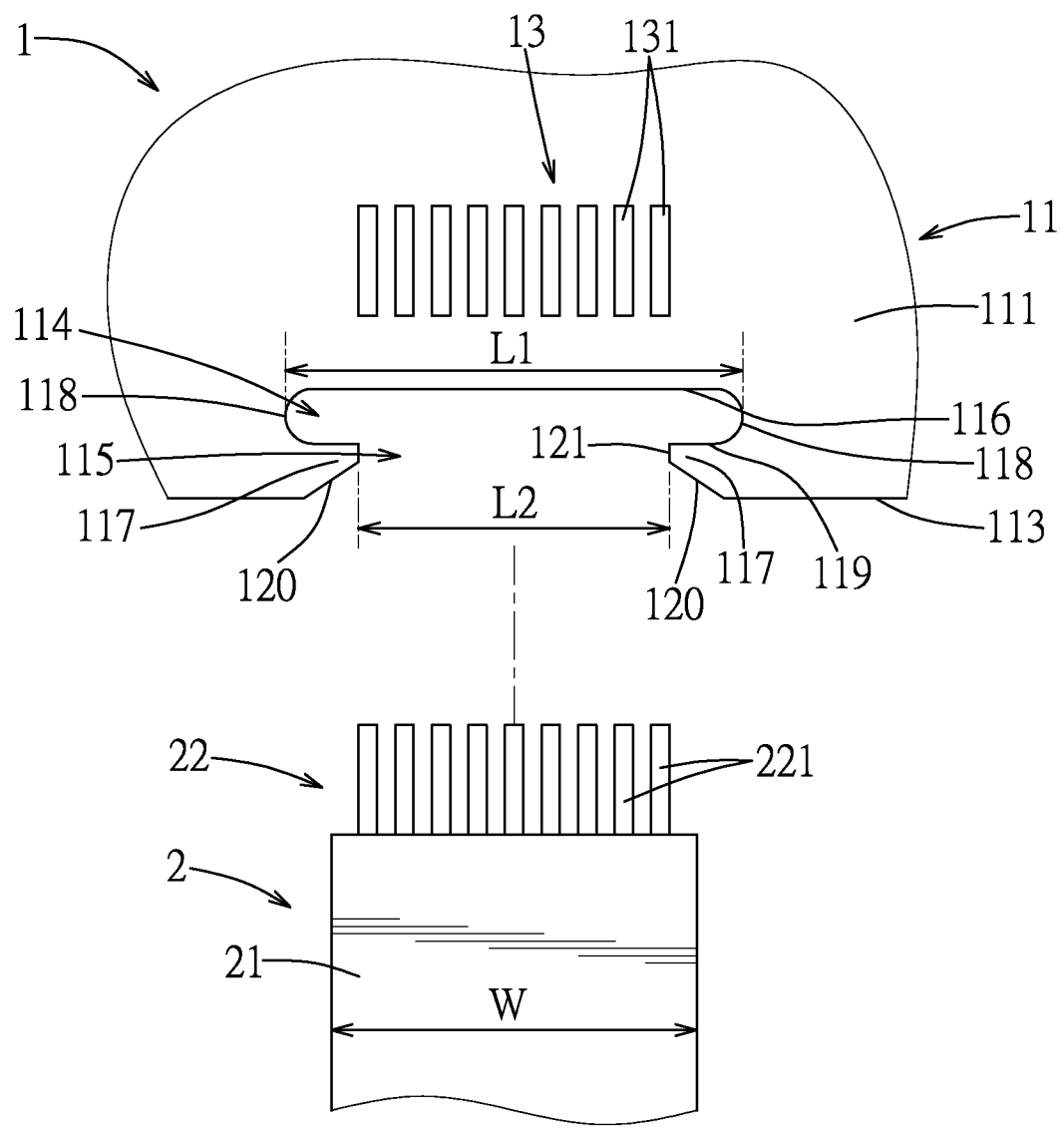
FIG. 2 is a schematic exploded top view of the first embodiment of the assembly of the flexible flat cable and the circuit board, illustrating the assembling relationship between the flexible flat cable and the circuit board.

Referring to FIGS. 1 and 2, a first embodiment of an assembly of a flexible flat cable and a circuit board according to the present disclosure is shown to include a circuit board 1 and a flexible flat cable 2.

The circuit board 1 includes a board body 11 and a connection module 13 disposed on the board body 11. The board body 11 includes a top face 111, a bottom face 112, and a side face 113 connected between the top face 111 and the bottom face 112. The connection module 13 is disposed on the top face 111 and is adjacent to the side face 113. The board body 11 is formed with a positioning slot 114 that is formed through the top face 111 and the bottom face 112 and that is spaced apart from and disposed between the connection module 13 and the side face 113, and an opening 115 that extends from the side face 113 to the positioning slot 114 and that is in spatial communication with the positioning slot 114. The positioning slot 114 is elongated and has a first length (L1). The opening 115 is formed through the top face 111 and the bottom face 112 and has a second length (L2) shorter than the first length (L1). The board body 11 further includes a long side 116 that defines one side of the positioning slot 114 adjacent to the connection module 13. The long side 116 faces toward the opening 115.

The flexible flat cable 2 includes a cable main body 21 and a connection unit 22 extending from one end of the cable main body 21. The connection unit 22 is fixed to the connection module 13 and is connected electrically to the connection module 13. The cable main body 21 has a width (W) greater than the second length (L2). The cable main body 21 is able to pass through the opening 115 and extends through and is positioned in the positioning slot 114. By configuring the second length (L2) of the opening 115 to be smaller than the first length (L1) of the positioning slot 114 and the width (W) of the cable main body 21 to be larger than the second length (L2) of the opening 115, the cable main body 21 is able to be stably positioned in the positioning slot 114 when extending through the positioning slot 114. Therefore, a connection strength between the flexible flat cable 2 and the circuit board 1 may be enhanced such that fracturing of the connection unit 22 or separation of the connection unit 22 from the connection module 13 may be alleviated when the cable main body 21 is pulled by an external force.

A specific structure of the circuit board 1 and an assembling method for the flexible flat cable 2 will now be described in detail.

Referring to FIGS. 1 and 2, the connection module 13 of the circuit board 1 includes a plurality of conductive contacts 131 disposed on the top face 111 of the board body 11. The connection unit 22 of the flexible flat cable 2 includes a plurality of core wires 221. The number of the core wires 221 is equal to that of the conductive contacts 131. Each of the core wires 221 may be fixed by a welding manner on and connected electrically to a respective one of the conductive contacts 131 so as to enable transmission of electrical signals. Preferably, the first length (L1) of the positioning slot 114 of the circuit board 11 is greater than or equal to the width (W) of the cable main body 21 such that the cable main body 21 may remain flat when extending through the positioning slot 114. In this embodiment, the first length (L1) is greater than the width (W) such that curling of the cable main body 21 caused by pressure exerted by the circuit board 11 may be prevented, thereby alleviating separation of each of the core wires 221 from the respective one of the conductive contacts 131.

The board body 11 of the circuit board 1 further includes two stop arms 117 that are spaced apart from each other and that cooperate to define the opening 115. The two stop arms 117 face toward the long side 116 and are spaced apart from the long side 116. The two stop arms 117 are configured to stop the cable main body 21 at one side that is opposite to the long side 116 when the cable main body 21 of the flexible flat cable 2 passes through the opening 115 to extend through and be positioned in the positioning slot 114. By virtue of the two stop arms 117, separation of the cable main body 21 from the positioning slot 114 via the opening 115 may be prevented when the cable main body 21 is pulled by the external force.

Specifically, the board body 11 of this embodiment further includes two short sides 118 that are respectively connected to opposite ends of the long side 116. The two short sides 118 cooperatively define the first length (L1) of the positioning slot 114 therebetween. The stop arms 117 extend respectively from the two short sides 118. Each of the stop arms 117 further includes a stop face 119 that faces toward the long side 116 and that is configured to stop the cable main body 21, a guiding inclined face 120 that is connected to the side face 113 and that extends slantwise in a direction from the side face 113 toward the long side 116, and an end face 121 connected between the stop face 119 and the guiding inclined face 120. The end faces 121 of the two stop arms 117 cooperate to define the second length (L2) of the opening 115 therebetween. The guiding inclined face 120 of each of the stop arms 117 is configured to abut against the cable main body 21 and guide entry of the cable main body 21 through the opening 115.

Figure 3:
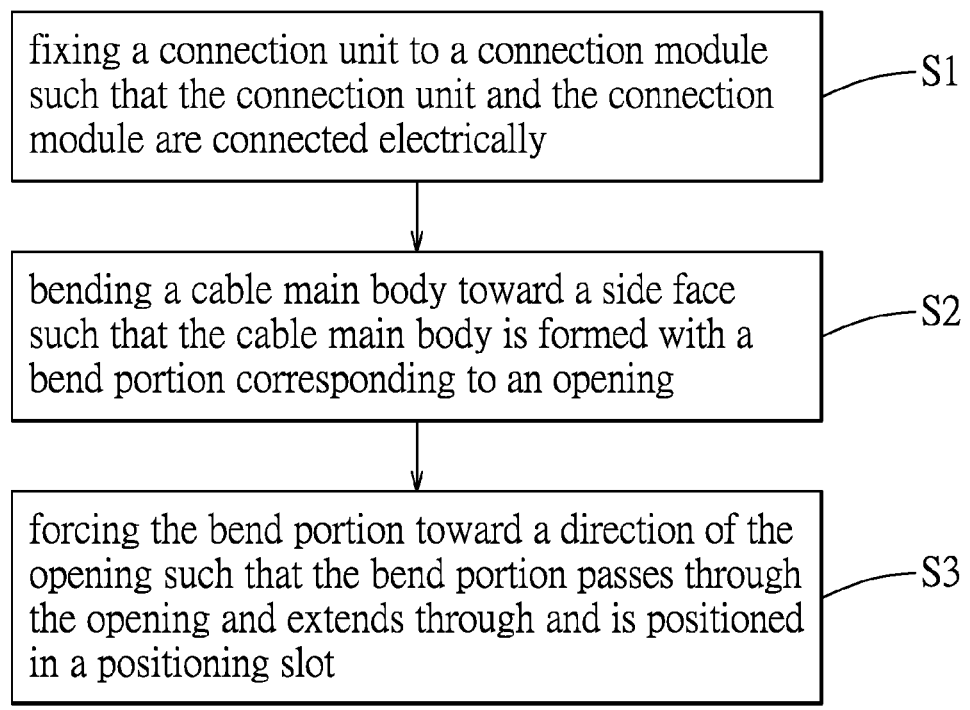
FIG. 3 is a flow chart of an assembling method for the flexible flat cable of the first embodiment of the assembly of the flexible flat cable and the circuit board.

FIG. 3 is a flow chart of an assembling method for the flexible flat cable 2. Referring to FIGS. 1 and 3, the assembling method mainly includes the following steps:

Step (S1), fixing the connection unit 22 of the flexible flat cable 2 to the connection module 13 of the circuit board 1 such that the connection unit 22 and the connection module 13 are connected electrically;

Step (S2), bending the cable main body 21 toward the side face 113 of the board body 11 such that the cable main body 21 is formed with a bend portion 211 (see FIG. 5) corresponding to the opening 115; and Step (S3), forcing the bend portion 211 of the cable main body 21 toward a direction of the opening 115 such that the bend portion 211 passes through the opening 115 and extends through and is positioned in the positioning slot 114.

Figure 4:
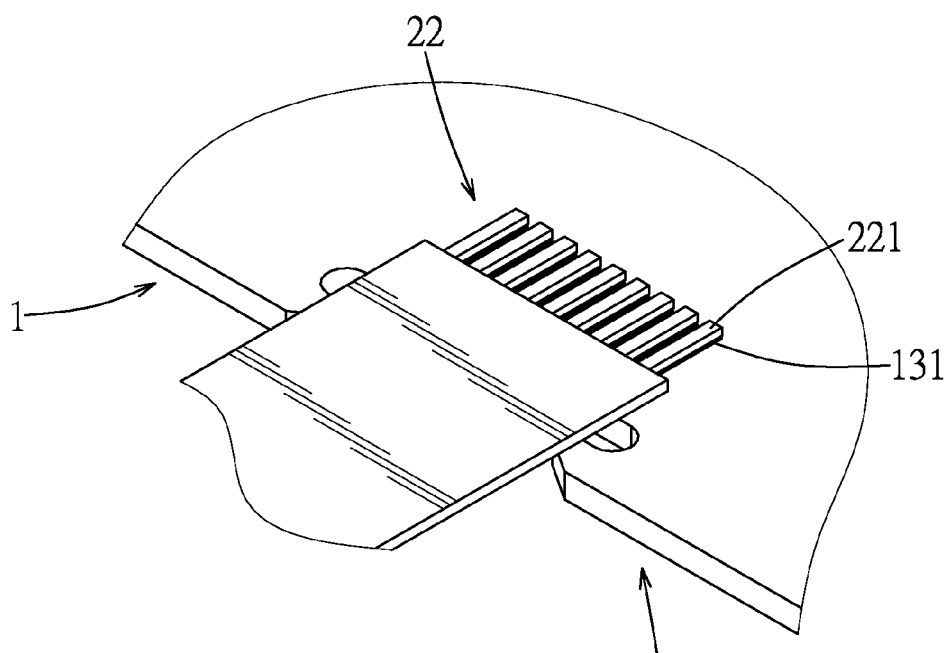
FIG. 4 is a schematic fragmentary perspective view of the first embodiment of the assembly of the flexible flat cable and the circuit board, illustrating that each of the core wires of the flexible flat cable is welded to a respective one of conductive contacts of the circuit board.

Referring to FIGS. 1, 3 and 4, in Step (S1), each of the core wires 221 of the connection unit 22 is overlaid and then welded to the respective one of the conductive contacts 131 of the connection module 13 such that each of the core wires 221 is fixed and connected electrically to the respective one of the conductive contacts 131.

Figure 5:
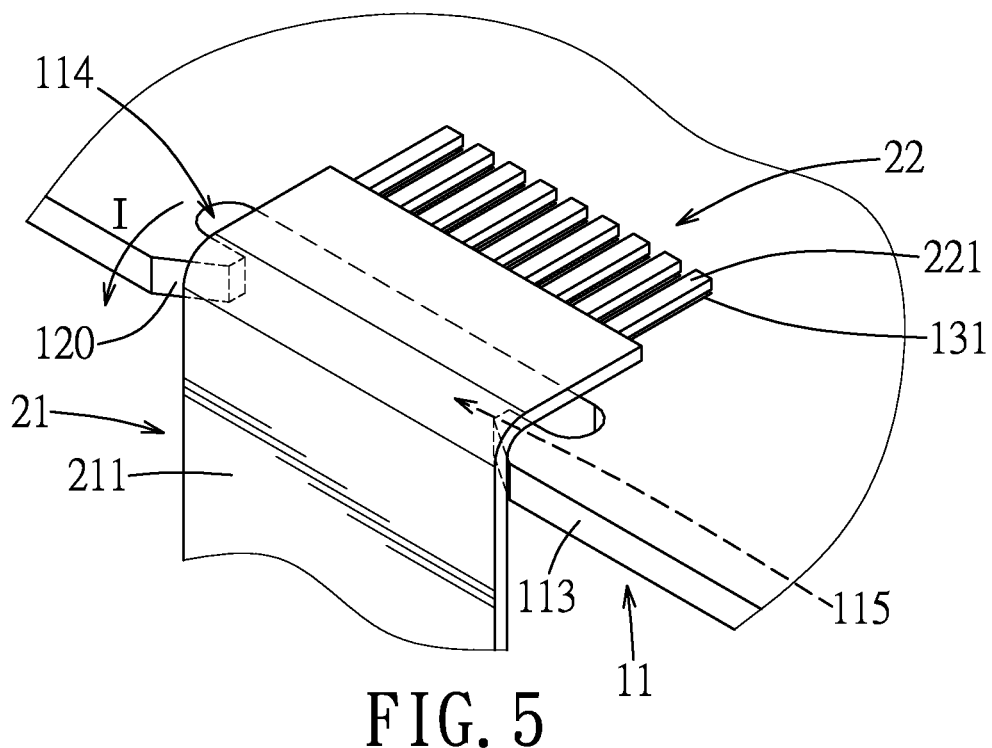
FIG. 5 is a schematic fragmentary perspective view of the first embodiment of the assembly of the flexible flat cable and the circuit board, illustrating that a cable main body of the flexible flat cable is bent toward a side face of the circuit board such that the cable main body is formed with a bend portion corresponding to an opening of the circuit board.
Figure 6:
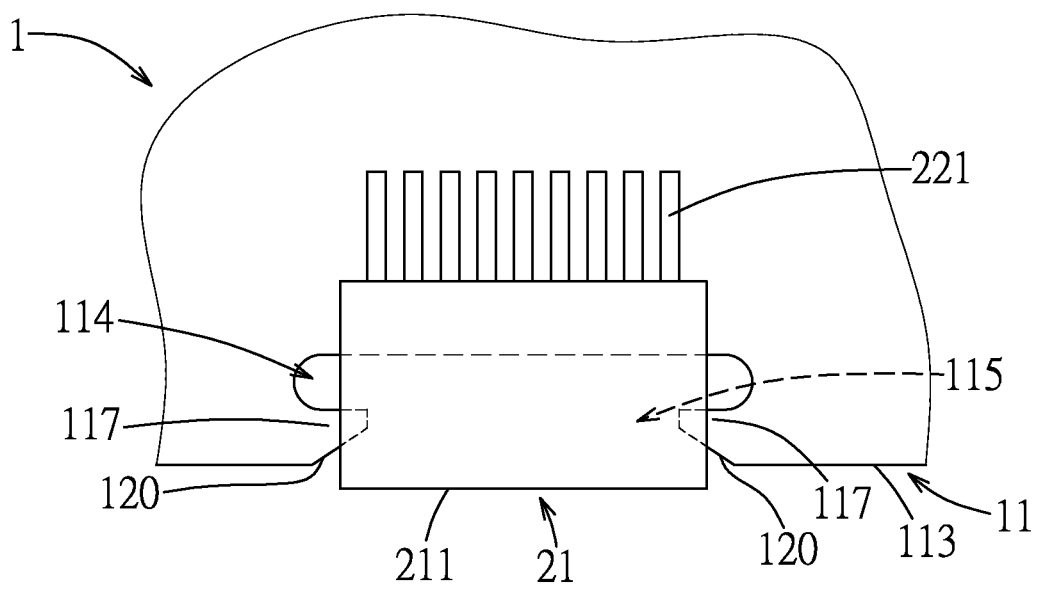
FIG. 6 is a schematic fragmentary top view of the first embodiment of the assembly of the flexible flat cable and the circuit board, illustrating that the bend portion of the cable main body is disposed to correspond to the opening and two guiding inclined faces of two stop arms of the circuit board.

Referring to FIGS. 3, 5 and 6, in Step (S2), a force is applied in a direction of an arrow (I) to bend the cable main body 21 toward the side face 113 of the board body 11 such that the cable main body 21 is formed with the bend portion 211 corresponding to the opening 115 and the guiding inclined faces 120 of the two stop arms 117.

Figure 7:
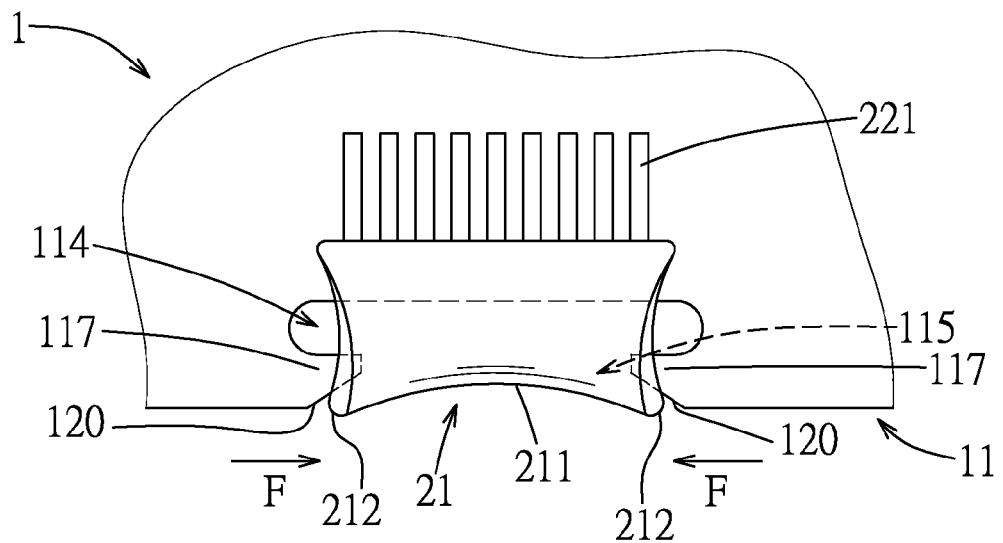
FIG. 7 is a schematic fragmentary top view of the first embodiment of the assembly of the flexible flat cable and the circuit board, illustrating that the bend portion of the cable main body is forced toward a direction of the opening.
Figure 8:
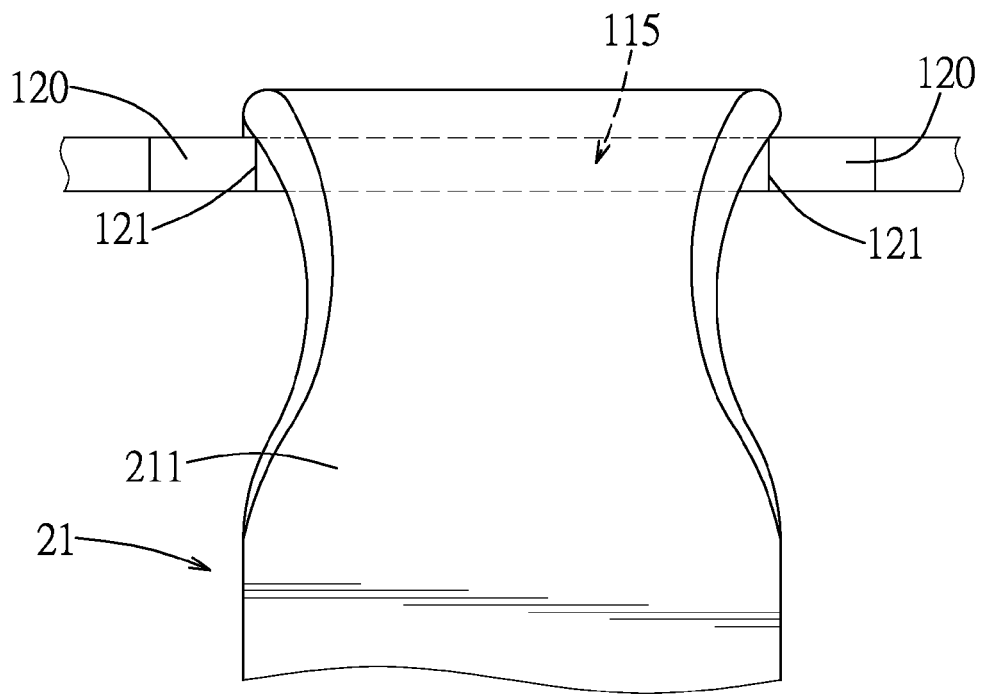
FIG. 8 is a schematic fragmentary side view of the first embodiment of the assembly of the flexible flat cable and the circuit board, illustrating that the bend portion of the cable main body moves to be between two end faces of the two stop arms.
Figure 9:
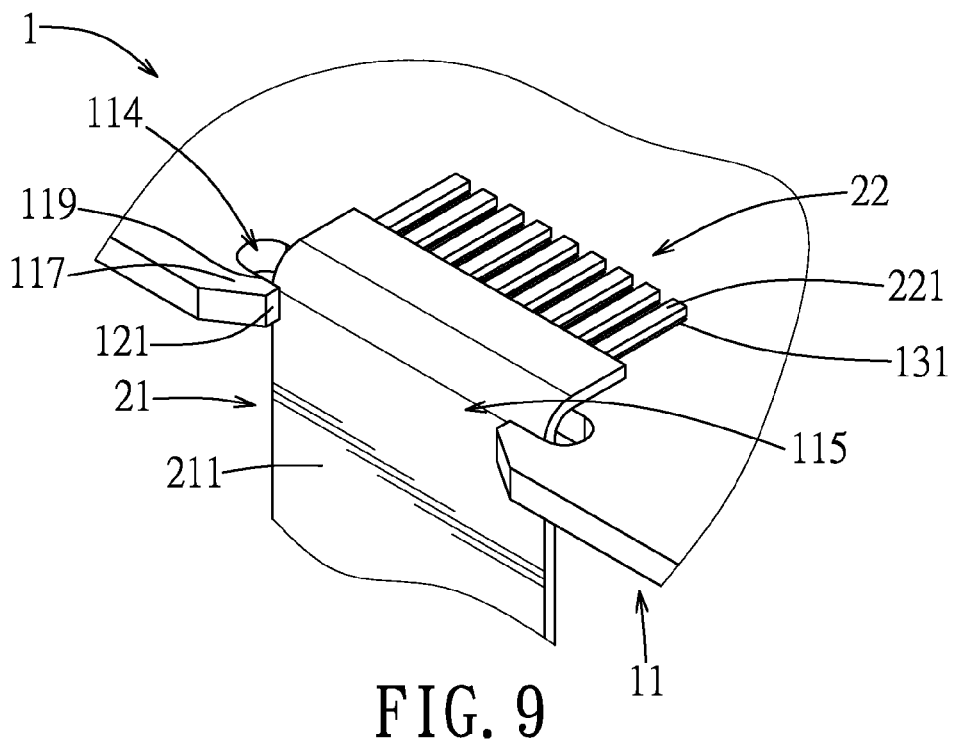
FIG. 9 is a schematic fragmentary perspective view of the first embodiment of the assembly of the flexible flat cable and the circuit board, illustrating that the bend portion extends through and is positioned in a positioning slot of the circuit board.

Referring to FIGS. 3, 7 and 8, Step (S3) is afterward executed. By taking advantage of the force that is applied for bending the cable main body 21, the bend portion 211 is forced toward the direction of the opening 115. As a result, two side edges 212 of the bend portion 211 respectively abut against the guiding inclined faces 120 of the two stop arms 117. Due to blocking of the two guiding inclined faces 120 that respectively block the two side edges 212 of the bend portion 211 and two component forces (F) that are respectively applied by the two guiding inclined faces 120 in two opposite directions on the two side edges 212, the bend portion 211 gradually curls and is formed into an arc-shaped as shown in FIG. 7. As the bend portion 211 gradually curls, the width (W) (as shown in FIG. 2) is gradually reduced. When the bend portion 211 moves to a position between the end faces 121 of the two stop arms 117, the width (W) is reduced to a size sufficient to permit passage through the opening 115. Referring further to FIG. 9, the bend portion 211 will afterwards move to be in the positioning slot 114 and separate from the end faces 121 of the two stop arms 117. At this moment, the bend portion 211 may be flattened to be positioned flatly in the positioning slot 114.

Figure 10:
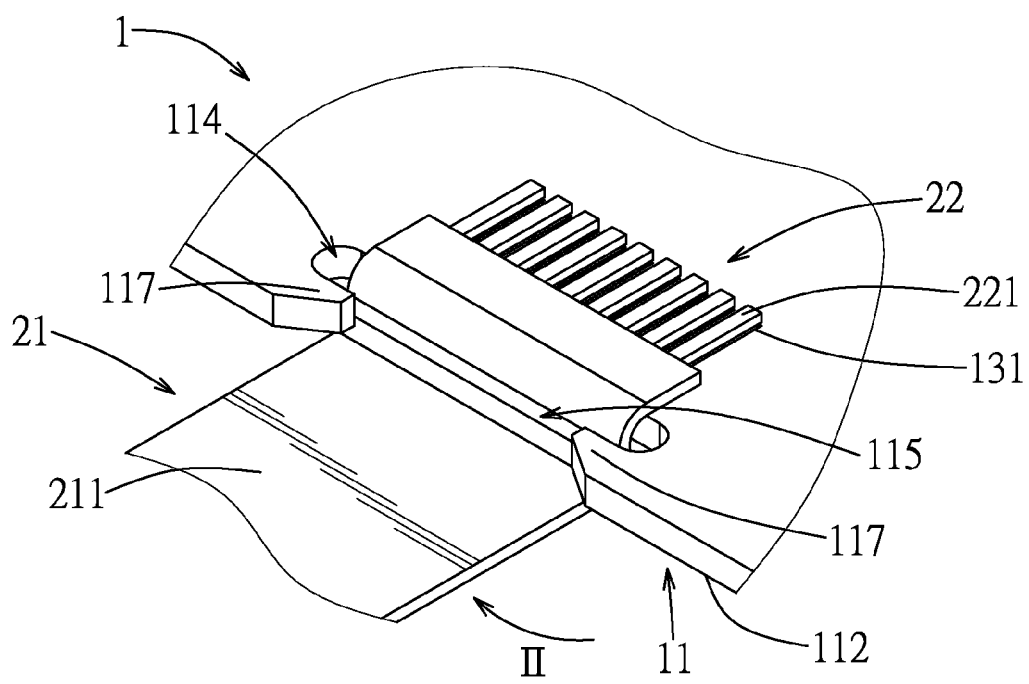
FIG. 10 is a schematic fragmentary perspective view of the first embodiment of the assembly of the flexible flat cable and the circuit board, illustrating that the bend portion is bent upward and is blocked by the two stop arms.

Referring to FIG. 10, the flexible flat cable 2 of this embodiment further includes another connection unit (not shown) extending from the other end of the cable main body 21 opposite to the connection unit 22. Therefore, after the bend portion 211 of the cable main body 21 extends through and is positioned in the positioning slot 114, the bend portion 211 that extends outward of the positioning slot 114 at the bottom face 112 of the board body 11 may be bent upward in a direction of an arrow (II) such that the another connection unit may be connected electrically to another circuit board (not shown). When the bend portion 211 is bent upward to abut against the two stop arms 117, the bend portion 211 is unable to rotate upward anymore. By virtue of the abovementioned configuration, when the bend portion 211 is forced to bend upward, separation of the bend portion 211 from the positioning slot 114, fracturing of each of the core wires 221, and separation of each of the core wires 221 from the respective one of the conductive contacts 131 may be prevented.

Figure 11:
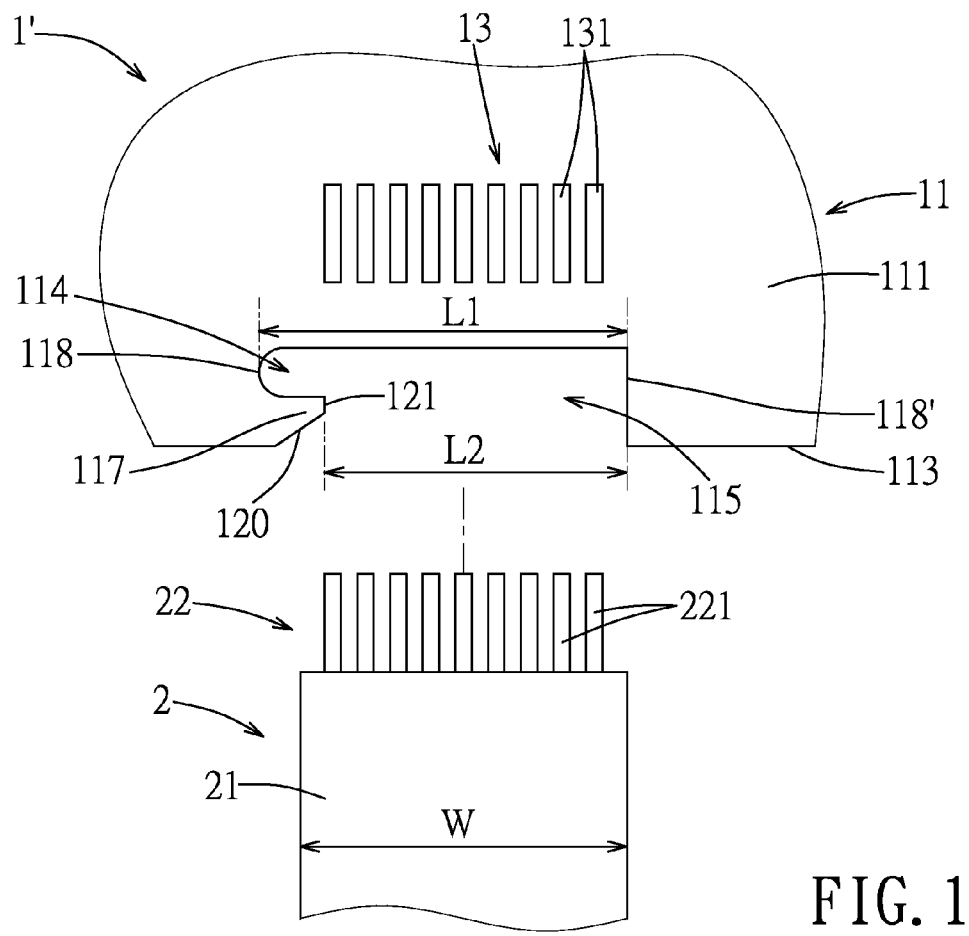
FIG. 11 is a schematic exploded top view of a second embodiment of the assembly of the flexible flat cable and the circuit board according to the present disclosure, illustrating an assembling relationship between the flexible flat cable and the circuit board.
Figure 12:
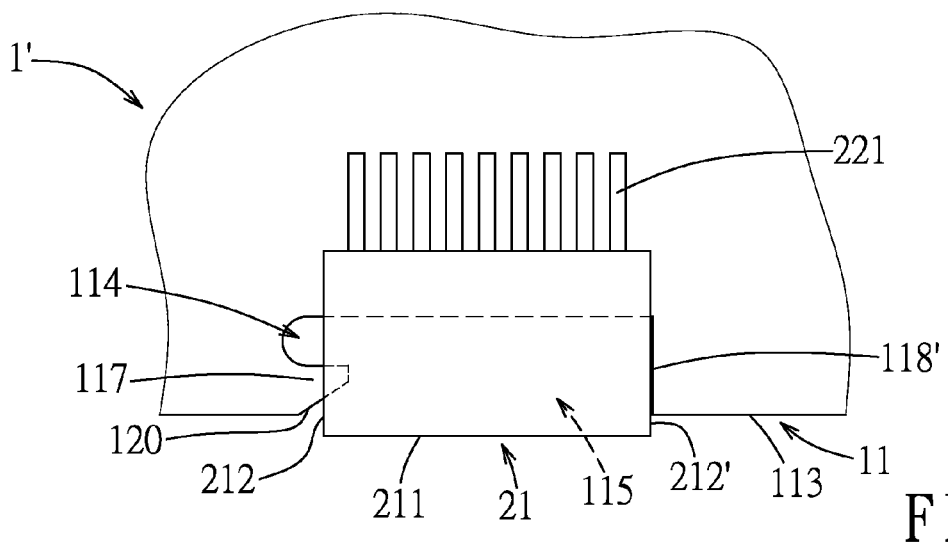
FIG. 12 is a schematic fragmentary top view of the second embodiment of the assembly of the flexible flat cable and the circuit board, illustrating that the bend portion of the cable main body is disposed to correspond to the opening and the guiding inclined face of the stop arm of the circuit board.
Figure 13:
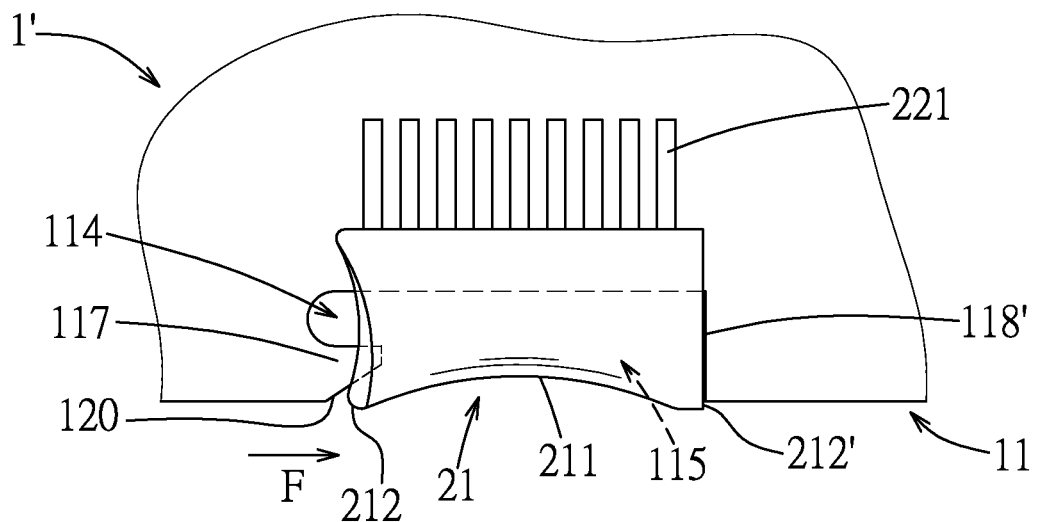
FIG. 13 is a schematic fragmentary top view of the second embodiment of the assembly of the flexible flat cable and the circuit board, illustrating that the bend portion of the cable main body is forced toward the direction of the opening.
Figure 14:
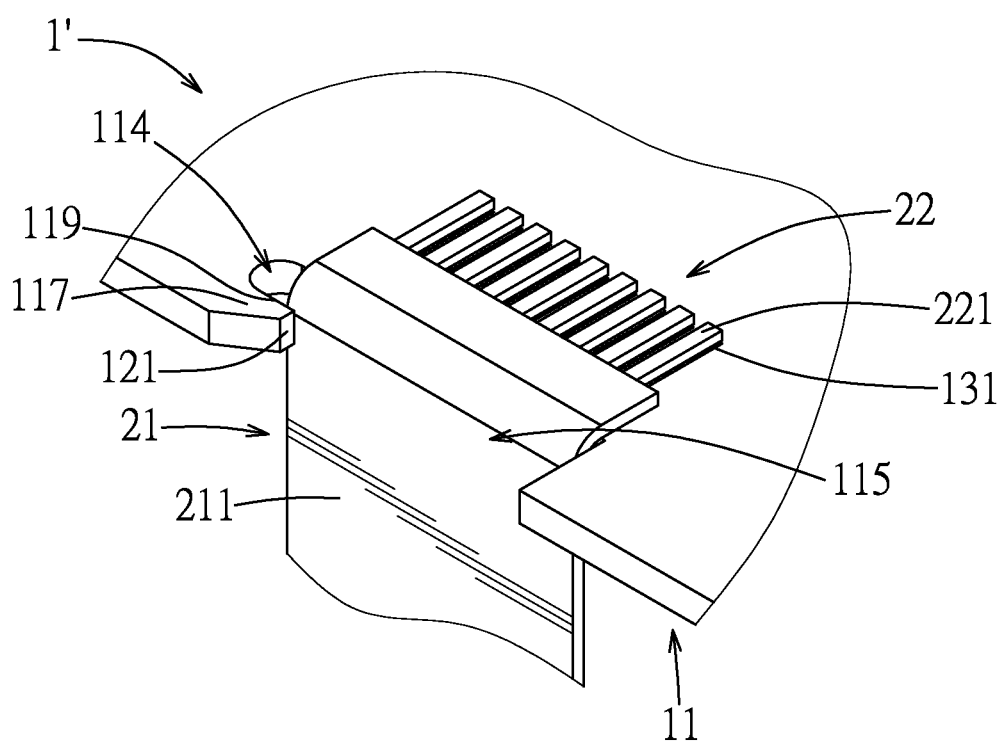
FIG. 14 is a schematic fragmentary perspective view of the second embodiment of the assembly of the flexible flat cable and the circuit board, illustrating that the bend portion extends through and is positioned in the positioning slot of the circuit board.

Referring to FIG. 11, a second embodiment of the assembly of the flexible flat cable and the circuit board according to the present disclosure is shown. An assembling method for the flexible flat cable 2 of the second embodiment is similar to that for the first embodiment. The difference with the first preferred embodiment resides in the configuration of the circuit board 1'.

In this embodiment, the stop arm 117 of the circuit board 1' is one in number. The stop arm 117 extends from one short side 118 of the two short sides 118, 118'. The other short side 118' of the two short sides 118, 118' extends to the side face 113 of the board body 11. The short side 118' cooperates with the end face 121 of the stop arm 117 to define therebetween the opening 115 and the second length (L2) of the opening 115.

Referring to FIGS. 3 and 12 to 14, in Step (S1) of the assembling method, each of the core wires 221 is welded to the respective one of the conductive contacts 131 such that each of the core wires 221 is fixed and connected electrically to the respective one of the conductive contacts 131. Subsequently, in Step (S2), the cable main body 21 is bent toward the side face 113 of the board body 11 such that the cable main body 21 is formed with the bend portion 211 corresponding to the opening 115 and the guiding inclined face 120 of the stop arm 117. Step (S3) is afterward executed. By taking advantage of the force that is applied for bending the cable main body 21, the bend portion 211 is forced toward the direction of the opening 115. As a result, one side edge 212 of the two side edges 212, 212' of the bend portion 211 abuts against the guiding inclined face 120 of the stop arm 117.

Due to blocking of the guiding inclined face 120 that blocks the side edge 212 of the bend portion 211 and a component force (F) that is applied by the guiding inclined face 120 on the side edge 212, the other one side edge 212' of the two side edges 212, 212' is urged to abut against the short side 118'. Moreover, a portion of the bend portion 211 that is adjacent to the side edge 212 and that abuts against the guiding inclined face 120 gradually curls and is formed into a shape shown in FIG. 13. As the bend portion 211 gradually curls, the width (W) (as shown in FIG. 2) is gradually reduced. When the bend portion 211 moves to a position between the end face 121 of the stop arm 117 and the short side 118', the width (W) is reduced to a size sufficient to permit passage through the opening 115. Thereafter, the bend portion 211 will move to be in the positioning slot 114 and separate from the end face 121 of the stop arm 117. At this moment, the bend portion 211 may be flattened to be positioned flatly in the positioning slot 114.

Figure 15:
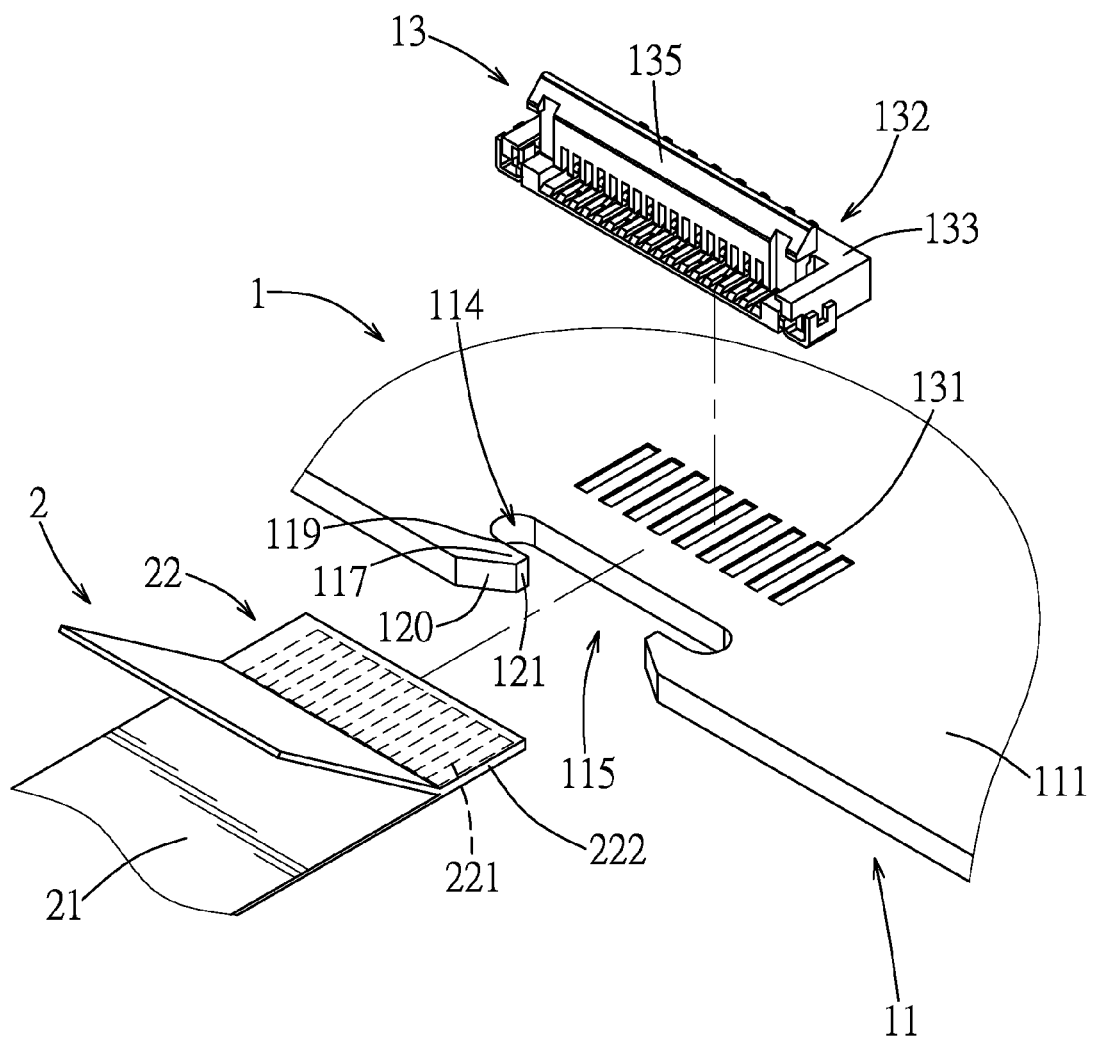
FIG. 15 is a schematic fragmentary exploded perspective view of a third embodiment of the assembly of the flexible flat cable and the circuit board according to the present disclosure, illustrating an assembling relationship between the flexible flat cable and the circuit board.

Referring to FIG. 15, a third embodiment of the assembly of the flexible flat cable and the circuit board according to the present disclosure is shown. An assembling method for the flexible flat cable 2 of the third embodiment is similar to that for the first embodiment. The differences with the first preferred embodiment reside in the configurations of the connection module 13 of the circuit board 1 and the connection unit 22 of the flexible flat cable 2.

Figure 16:
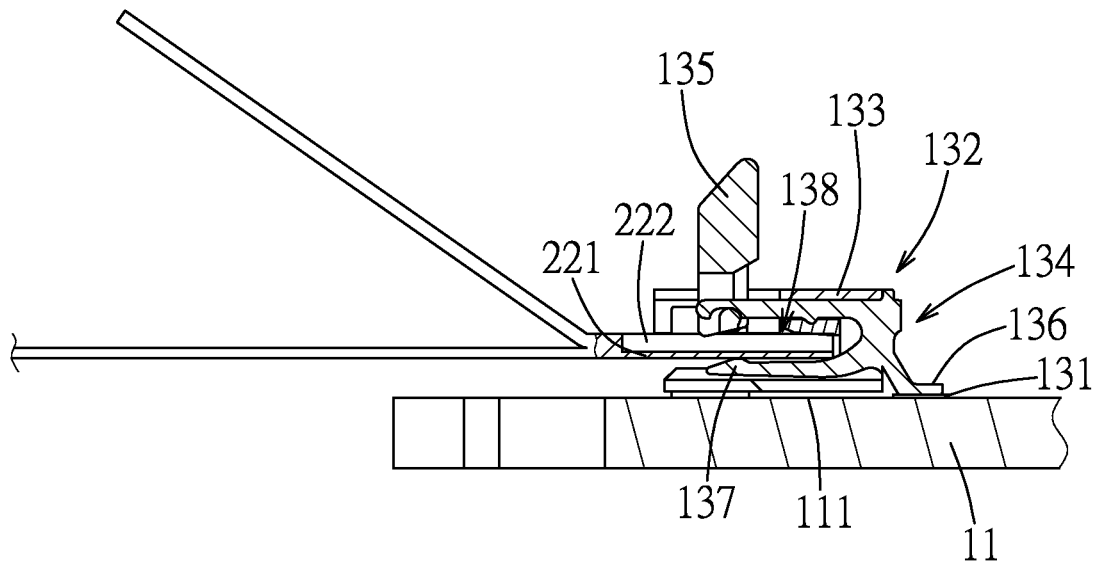
FIG. 16 is a schematic fragmentary partly sectional view of the third embodiment of the assembly of the flexible flat cable and the circuit board, illustrating that an insert plate of a connection unit of the flexible flat cable is inserted into an insert slot of an insulation main body of the circuit board, and each of core wires of the flexible flat cable abuts to contact a spring arm portion of a respective one of conductive pins of the circuit board.
Figure 17:
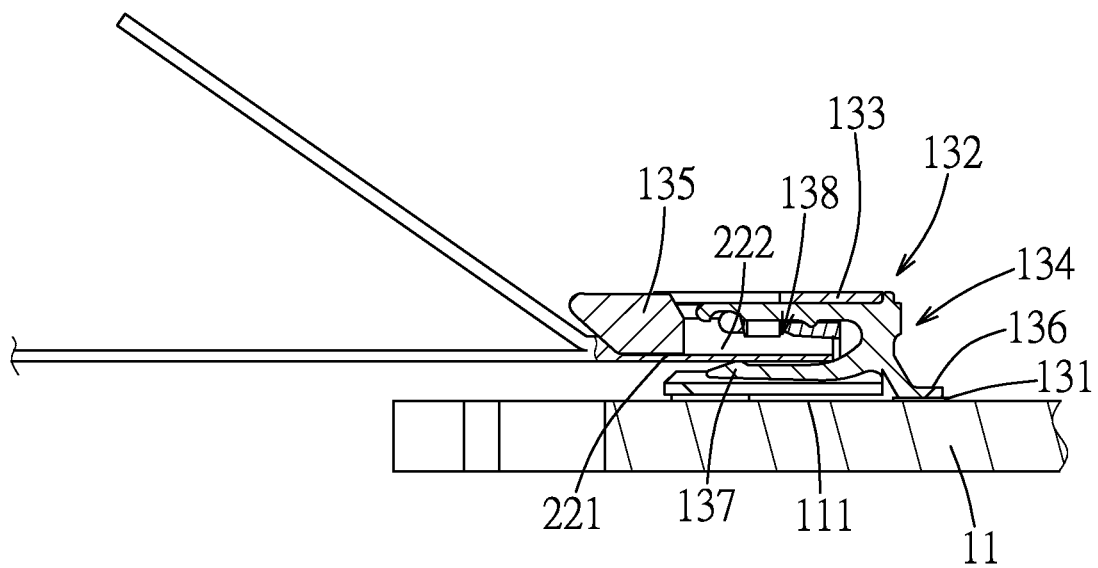
FIG. 17 is a schematic fragmentary partly sectional view of the third embodiment of the assembly of the flexible flat cable and the circuit board, illustrating that a pressing lid presses downward the insert plate such that each of the core wires abuts tightly the spring arm portion of the respective one of the conductive pins.

Referring to FIGS. 15 to 17, in this embodiment, the connection module 13 further includes a flexible flat cable connector 132. The flexible flat cable connector 132 includes an insulation main body 133 fixed to the top face 111 of the board body 11, a plurality of conductive pins 134 (only one of the conductive pins is shown in FIG. 16) disposed in the insulation main body 133, and a pressing lid 135 mounted rotatably to the insulation main body 133. Each of the conductive pins 134 includes a welding portion 136 extending outward of the insulation main body 133, and a spring arm portion 137. Each of the welding portions 136 is configured to be welded to the respective one of the conductive contacts 131. The spring arm portion 137 is disposed in an insert slot 138 defined by the insulation main body 133. The connection unit 22 includes an insert plate 222 that extends from one end of the cable main body 21 and that is configured to be inserted into the insert slot 138. The core wires 221 are embedded in the insert plate 222. Each of the core wires 221 is configured to abut and contact the spring arm portion 137 of a respective one of the conductive pins 134.

In Step (S1) of the assembling method, the insert plate 222 of the connection unit 22 is inserted into the insert slot 138 of the insulation main body 133 such that each of the core wires 221 abuts to contact the spring arm portion 137 of the respective one of the conductive pins 134. Afterwards, the pressing lid 135 is rotated from an open position shown in FIG. 16 to a pressing position shown in FIG. 17 where the pressing lid 135 presses downward the insert plate 222. At this moment, the insert plate 222 is fixed within the insertion slot 138, and each of the core wires 221 abuts tightly the respective one of the spring arm portions 137. Therefore, each of the core wires 221 is connected electrically to the respective one of the conductive contacts 131 through the respective one of the conductive pins 134, thereby enabling transmission of electrical signals.

Figure 18:
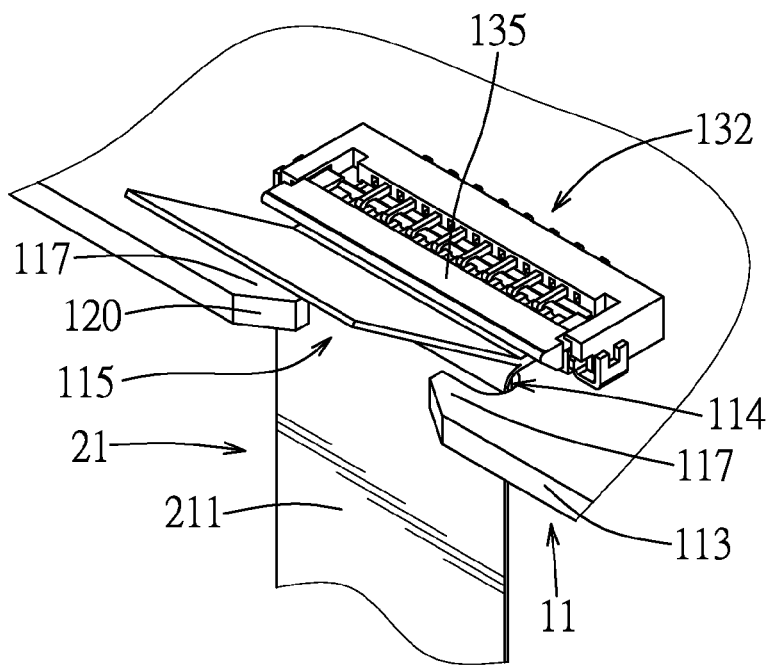
FIG. 18 is a schematic fragmentary perspective view of the third embodiment of the assembly of the flexible flat cable and the circuit board, illustrating that the bend portion of the cable main body of the flexible flat cable extends through and is positioned in the positioning slot of the circuit board.

Referring to FIGS. 3 and 18, in Step (S2), the cable main body 21 is bent toward the side face 113 of the board body 11 such that the cable main body 21 is formed with the bend portion 211 corresponding to the opening 115 and the guiding inclined faces 120 of the two stop arms 117. Step (S3) is afterward executed, in which the bend portion 211 of the cable main body 21 is forced toward the direction of the opening 115 such that the bend portion 211 passes through the opening 115 and extends through and is positioned in the positioning slot 114.

Figure 19:
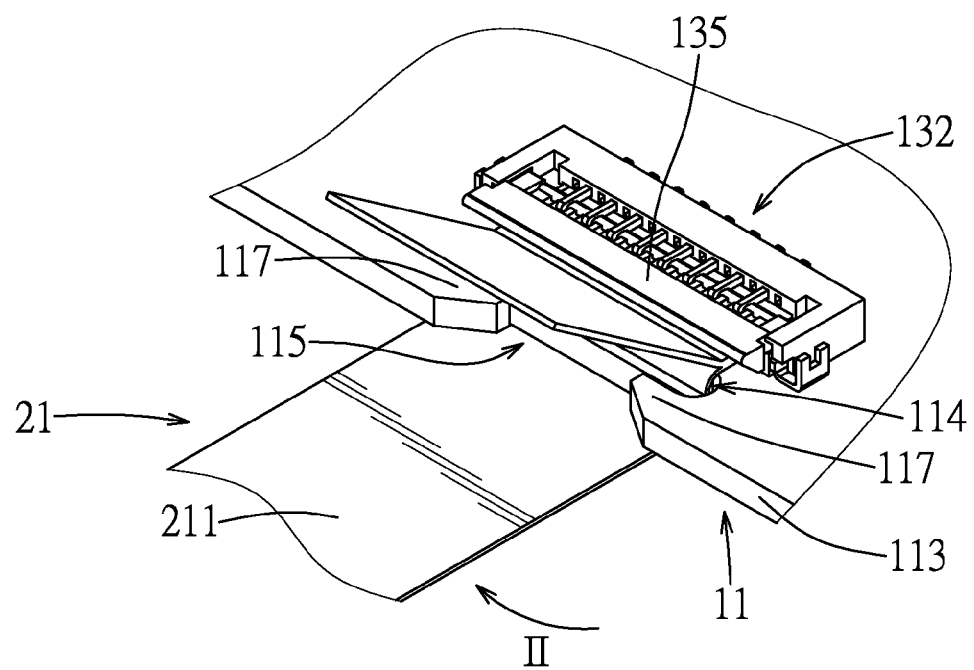
FIG. 19 a schematic fragmentary perspective view of the third embodiment of the assembly of the flexible flat cable and the circuit board, illustrating that the bend portion is bent upward and is blocked by the stop arms of the circuit board.

Referring to FIG. 19, when the bend portion 211 is subsequently bent upward in the direction of an arrow (II) to abut against bottom ends of the two stop arms 117, the bend portion 211 is unable to rotate upward anymore. With such configuration, when the bend portion 211 is forced to bend upward, separation of the bend portion 211 from the positioning slot 114 may be prevented. Moreover, separation of the insert plate 222 (shown in FIG. 17) from the insert slot 138 (shown in FIG. 17) caused by the insert plate 222 forcing upward the pressing lid 135 may be prevented.

To conclude, by virtue of the positioning slot 114 and the opening 115 that are formed in the board body 11 of the circuit board 1, 1' in each of the embodiments, the cable main body 21 is able to pass through the opening 115 and extend through and be positioned in the positioning slot 114. Moreover, by virtue of the stop arms 117 of the circuit board 1, 1', the cable main body 21 is stopped and is stably positioned in the positioning slot 114. With the abovementioned configurations, the connection strength between the flexible flat cable 2 and the circuit board 1, 1' is enhanced such that fracturing of the connection unit 22 or separation of the connection unit 22 from the connection module 13 may be prevented when the cable main body 21 is pulled by the external force. Furthermore, additional fixing units for fixing the cable main body 21 may be omitted, thereby effectively saving manufacturing cost and assembling time. In addition, by virtue of the assembling order, fixing the connection unit 22 of the flexible flat cable 2 to the connection module 13 of the circuit board 1, 1' and then bending the cable main body 21 so as to enable the bend portion 211 to pass through the opening 115 and to extend through and be positioned in the positioning slot 114, the convenience of assembling the flexible flat cable 2 may be increased and the flexible flat cable 2 may therefore be assembled with and fixed on the circuit board 1, 1' quickly and conveniently.

While the present disclosure has been described in connection with what are considered the most practical embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An assembly of a circuit board and a flexible flat cable, comprising:
    a circuit board including a board body and a connection module disposed on the board body, the board body including a top face, a bottom face, and a side face connected between the top face and the bottom face, the connection module being disposed on the top face, the board body being formed with a positioning slot that is formed through the top face and the bottom face and that is spaced apart from and disposed between the connection module and the side face, and an opening that extends from the side face to the positioning slot and that is in spatial communication with the positioning slot, the positioning slot being elongated and having a first length, the opening being formed through the top face and the bottom face and having a second length shorter than the first length, the board body further including a long side that defines one side of the positioning slot adjacent to the connection module, the long side facing toward the opening; and
    a flexible flat cable including a cable main body and a connection unit extending from one end of the cable main body, the connection unit being fixed to the connection module and connected electrically to the connection module, the cable main body having a width greater than the second length, the cable main body being able to pass through the opening and extending through and being positioned in the positioning slot;
    wherein the board body includes at least one stop arm that faces toward the long side and that is spaced apart from the long side, the stop arm being configured to stop the cable main body; and
    wherein the stop arm includes a guiding inclined face that is connected to the side face and that extends slantwise in a direction from the side face toward the long side, the guiding inclined face facing away from the positioning slot for abutting against the cable main body and for guiding entry of the cable main body through the opening.

2. The assembly of a circuit board and a flexible flat cable as claimed in claim 1, wherein the first length of the positioning slot is greater than or equal to the width of the cable main body.

3. The assembly of a circuit board and a flexible flat cable as claimed in claim 1, wherein the board body further includes two short sides that are respectively connected to opposite ends of the long side, the two short sides cooperatively defining the first length of the positioning slot therebetween, the stop arm extending from one of the two short sides and including an end face connected to the guiding inclined face, the other one of the two short sides extending to the side face and cooperating with the end face of the stop arm to define the second length of the opening therebetween.

4. The assembly of a circuit board and a flexible flat cable as claimed in claim 1, wherein the board body includes two of the stop arms that are spaced apart from each other and that cooperate to define the opening, the stop arms facing toward the long side and being spaced apart from the long side, the stop arms being configured to stop the cable main body.

5. The assembly of a circuit board and a flexible flat cable as claimed in claim 4, wherein each of the stop arms includes a guiding inclined face that is connected to the side face and that extends slantwise in a direction from the side face toward the long side, the guiding inclined face being configured to abut against the cable main body and guide entry of the cable main body through the opening.

6. The assembly of a circuit board and a flexible flat cable as claimed in claim 5, wherein the board body further includes two short sides that are respectively connected to opposite ends of the long side, the two short sides cooperatively defining the first length of the positioning slot therebetween, the stop arms extending respectively from the two short sides, each of the stop arms further including an end face connected to the guiding inclined face, the end faces of the two stop arms cooperating to define the second length of the opening therebetween.

7. A circuit board suitable for assembling with a flexible flat cable, the flexible flat cable including a cable main body and a connection unit extending from one end of the cable main body, the cable main body having a width, the circuit board comprising:
    a board body including a top face, a bottom face, and a side face connected between the top face and the bottom face, the board body being formed with a positioning slot that is formed through the top face and the bottom face and that is spaced apart from the side face, and an opening that extends from the side face to the positioning slot and that is in spatial communication with the positioning slot, the positioning slot being elongated and having a first length, the opening being formed through the top face and the bottom face and having a second length shorter than the first length, the width of the cable main body being greater than the second length, the cable main body being able to pass through the opening to extend through and be positioned in the positioning slot; and
    a connection module disposed on the top face of the board body and configured to fix the connection unit and to connect electrically to the connection unit; and
    the positioning slot of the board body being disposed between the connection module and the side face, the board body further including a long side that defines one side of the positioning slot adjacent to the connection module, the long side facing toward the opening;
    wherein the board body includes at least one stop arm that faces toward the long side and that is spaced apart from the long side, the stop arm being configured to stop the cable main body; and
    wherein the stop arm includes a guiding inclined face that is connected to the side face and that extends slantwise in a direction from the side face toward the long side, the guiding inclined face facing away from the positioning slot for abutting against the cable main body and for guiding entry of the cable main body through the opening.

8. The circuit board as claimed in claim 7, wherein the first length of the positioning slot is greater than or equal to the width of the cable main body.

9. The circuit board as claimed in claim 7, wherein the board body further includes two short sides that are respectively connected to opposite ends of the long side, the two short sides cooperatively defining the first length of the positioning slot therebetween, the stop arm extending from one of the two short sides and including an end face connected to the guiding inclined face, the other one of the two short sides extending to the side face and cooperating with the end face of the stop arm to define the second length of the opening therebetween.

10. The circuit board as claimed in claim 7, wherein the board body includes two of the stop arms that are spaced apart from each other and that cooperate to define the opening, the stop arms facing toward the long side and being spaced apart from the long side, the stop arms being configured to stop the cable main body.

11. The circuit board as claimed in claim 10, wherein each of the stop arms includes a guiding inclined face that is connected to the side face and that extends slantwise in a direction from the side face toward the long side, the guiding inclined face being configured to abut against the cable main body and guide entry of the cable main body through the opening.

12. The circuit board as claimed in claim 11, wherein the board body further includes two short sides that are respectively connected to opposite ends of the long side, the two short sides cooperatively defining the first length of the positioning slot therebetween, the stop arms extending respectively from the two short sides, each of the stop arms further including an end face connected to the guiding inclined face, the end faces of the two stop arms cooperating to define the second length of the opening therebetween.

* * * * *